United States Patent [19]

Oka et al.

[11] Patent Number: 5,725,948
[45] Date of Patent: Mar. 10, 1998

[54] ADHESIVE TAPE FOR ELECTRONIC PARTS AND LIQUID ADHESIVE

[75] Inventors: Osamu Oka; Takeshi Nishigaya, both of Shizuoka, Japan

[73] Assignee: Tomoegawa Paper Co., Ltd., Tokyo, Japan

[21] Appl. No.: 704,068

[22] Filed: Aug. 28, 1996

[30] Foreign Application Priority Data

Aug. 31, 1995 [JP] Japan .................... 7-245150

[51] Int. Cl.$^6$ .................. B32B 7/12; B32B 9/04; B32B 15/08; B32B 27/00
[52] U.S. Cl. .................. 428/355; 428/343; 428/344; 428/447; 428/458; 428/473.5
[58] Field of Search .................. 428/41.7, 344, 428/355, 343, 447, 458, 473.5

[56] References Cited

U.S. PATENT DOCUMENTS

| | | | |
|---|---|---|---|
| 4,904,758 | 2/1990 | Kunimune et al. | 528/353 |
| 4,933,219 | 6/1990 | Sakumoto et al. | 428/41.8 |
| 5,032,438 | 7/1991 | Sakumoto et al. | 428/41.8 |
| 5,091,251 | 2/1992 | Sakumoto et al. | 528/352 |
| 5,212,279 | 5/1993 | Nomura et al. | 528/184 |
| 5,254,412 | 10/1993 | Fujimoto | 428/473.5 |
| 5,272,247 | 12/1993 | Sotokawa et al. | 528/353 |
| 5,277,972 | 1/1994 | Sakumoto et al. | 428/355 CN |
| 5,298,304 | 3/1994 | Narushima et al. | 428/41.7 |
| 5,446,080 | 8/1995 | Shima et al. | 524/99 |
| 5,480,965 | 1/1996 | Yamashita et al. | 528/323 |
| 5,494,797 | 2/1996 | Sakumoto et al. | 428/447 |
| 5,508,337 | 4/1996 | Yamashita et al. | 528/353 |
| 5,510,189 | 4/1996 | Sakumoto et al. | 428/447 |
| 5,512,628 | 4/1996 | Sakumoto et al. | 524/530 |
| 5,514,748 | 5/1996 | Isutsumi et al. | 524/600 |

*Primary Examiner*—Patrick Ryan
*Assistant Examiner*—Cathy F. Lam
*Attorney, Agent, or Firm*—Lowe, Price, LeBlanc & Becker

[57] ABSTRACT

This invention provides an adhesive tape and a liquid adhesive for electronic parts having sufficient thermal resistance and reliability. The adhesive tape of the invention comprises an adhesive layer composed of at least a polyimide selected from (I) a polyimide comprising the repeating unit represented by the following formula (1), (II) a polyimide comprising the repeating unit represented by the following formula (2), and (III) a polyimide comprising the repeating units represented by the following formulas (1) and (2) in a suitable proportion, provided on at least one surface of a heat resistance film or on a surface of a release film:

wherein Ar is a divalent group having aromatic rings, Ra is a divalent group having 2 to 6 benzene rings; Rb is an alkylene group having 2 to 20 carbon atoms, a specific ether group or a specific dimethylsiloxane group: $X^1$ is NH, NR (R is a $C_1$–$C_4$ alkyl group or alkoxy group) or S; and $X^2$ is NH, NR (R is a $C_1$–$C_4$ alkyl group or alkoxy group).

or S.

7 Claims, 2 Drawing Sheets

ADHESIVE TAPE FOR ELECTRONIC PARTS AND LIQUID ADHESIVE

BACKGROUND OF THE INVENTION

1) Field of the Invention

The present invention relates to adhesive tapes for electronic parts to be used for adhering between parts around leadframes making up a semiconductor device, e.g., lead pins, semiconductor chip mounted substrates, heat spreader, semiconductors themselves.

2) Description of the Related Art

Conventionally, adhesive tapes for fixing a leadframe, TAB tapes, etc., are used as adhesive tapes for use in the interior of resin-molded type semiconductor devices. For example, the adhesive tapes for fixing a leadframe have been used to fix lead pins of the leadframe in order to enhance the efficiency for producing the leadframe itself and the whole semiconductor assembly stages. In general, a leadframe manufacturer tapes a leadframe, and brings it to a semiconductor manufacturer, at which a semiconductor chip is mounted thereon followed by molding the leadframe with a resin. For this reason, it has been required for the adhesive tapes for fixing the leadframe not only to possess general reliability in a level required for semiconductor and enough processability at the time of taping, but also to possess sufficient adhesive strength at room temperature immediately after taping and heat resistance enough for withstanding thermal process at the stages of assembling semiconductor devices.

Conventionally, the adhesive tapes for use in such an application include adhesive tapes applying on a support film of a polyimide film, etc., an adhesive comprising polyacrylonitrile, polyacrylate or a synthetic rubber resin such as acrylonitrile-butadiene copolymer solely, or modified with any other resin or blended with any other resin to come into a B-stage.

In recent years, resin-molded type semiconductor devices as shown in FIGS. 1 to 3 have been developed or produced. In FIG. 1, the device has a construction in which lead pins 3 and plane 2 are connected by means of an adhesive layer 6, a semiconductor chip 1 is mounted on the plane 2, and together with bonding wires 4 between the semiconductor chip 1 and the lead pins 3, they are molded with a resin 5. In FIG. 2, the device has a construction in which the lead pins 3 on the leadframe are fixed with the semiconductor chip 1 and an adhesive layer 6 and together with a bonding wire 4, they are molded with a resin 5. In FIG. 3, the device has a construction in which a semiconductor chip 1 is mounted on a die pad 7, electrode 8 is fixed with an adhesive layer 6, the spaces between semiconductor chip 1 and an electrode 8 and between the electrode 8 and lead pins 3 are each connected with bonding wires 4, and they are molded with a resin 5.

In the adhesive layer in the resin-molded type semiconductor devices shown in FIGS. 1 to 3, the use of an adhesive tape to which a conventional adhesive is applied has the problems that the generated gas stains the lead to cause deterioration of the adhesive strength or causes generation of package crack, because of insufficient heat resistance.

The present invention has been made in the light of such situations associated with the prior arts and in order to improve such situations. An object of the present invention is, therefore, to provide an adhesive tape and a liquid adhesive for electronic parts having sufficient heat resistance and reliability.

SUMMARY OF THE INVENTION

An adhesive tape for electronic parts according to the first aspect of the present invention comprises an adhesive layer composed of at least a polyimide selected from (I) a polyimide comprising the repeating unit represented by the following formula (1), (II) a polyimide comprising the repeating unit represented by the following formula (2), and (III) a polyimide comprising the repeating units represented by the following formulas (1) and (2) in a suitable proportion, provided on at least one surface of a heat resistance film:

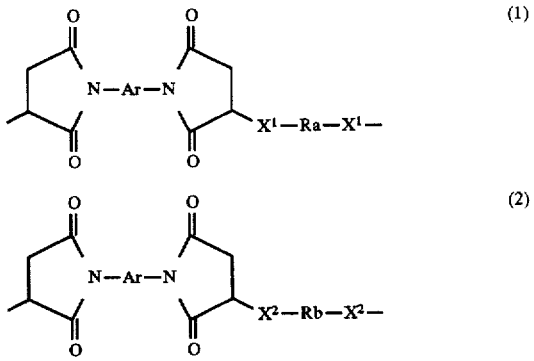

wherein Ar is a divalent group represented by the following formula (3) or the formula (4)

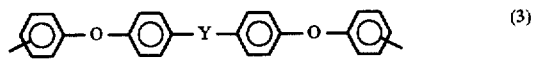

wherein Y is —O—, —CO—, —S—, —SO$_2$— or —C(CH$_3$)$_2$—.

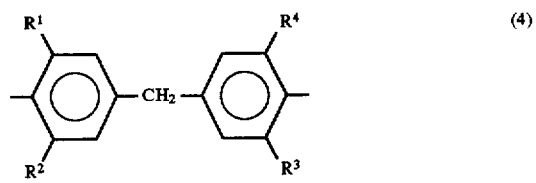

wherein

R$^1$, R$^2$, R$^3$ and R$^4$ are each an alkyl group having 1 to 4 carbon atoms or an alkoxy group having 1 to 4 carbon atoms;

Ra represents a divalent group having 2 to 6 benzene rings;

Rb represents an alkylene group having 2 to 20 carbon atoms, an ether group: —CH$_2$CH$_2$(OCH$_2$CH$_2$)$_n$— (wherein n is an integer of from 1 to 8), or a dimethylsiloxane group:

—R'—[Si(CH$_3$)$_2$O]$_m$Si(CH$_3$)$_2$—R'— (wherein R' is an alkyl group having 1 to 10 carbon atoms or —CH$_2$OC$_6$H$_4$— where —CH$_2$— attaches to Si atom, and m is an integer of 1 to 20);

X$^1$ is NH, NR (wherein R is an alkyl group having 1 to 4 carbon atoms or an alkoxy group having 1 to 4 carbon atoms) or S; and X$^2$ is NH, NR (wherein R is an alkyl group having 1 to 4 carbon atoms or an alkoxy group having 1 to 4 carbon atoms).

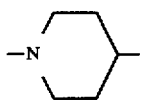

or S.

An adhesive tape for electronic parts according to the second aspect of the present invention comprises an adhesive layer composed of at least a polyimide selected from (I) a polyimide comprising the repeating unit represented by the above formula (1), (II) a polyimide comprising the repeating unit represented by the above formula (2), and (III) a polyimide comprising the repeating units represented by the above formulas (1) and (2) in a suitable proportion, provided on a surface of a release film.

A liquid adhesive for electronic parts according to the present invention comprises at least a polyimide selected from (I) a polyimide comprising the repeating unit represented by the above formula (I), (II) a polyimide comprising the repeating unit represented by the above formula (2), and (III) a polyimide comprising the repeating units represented by the above formulas (1) and (2) in a suitable proportion, dissolved in an organic solvent.

DETAILED DESCRIPTION OF PREFERRED EMBODIMENTS

Figure 1:
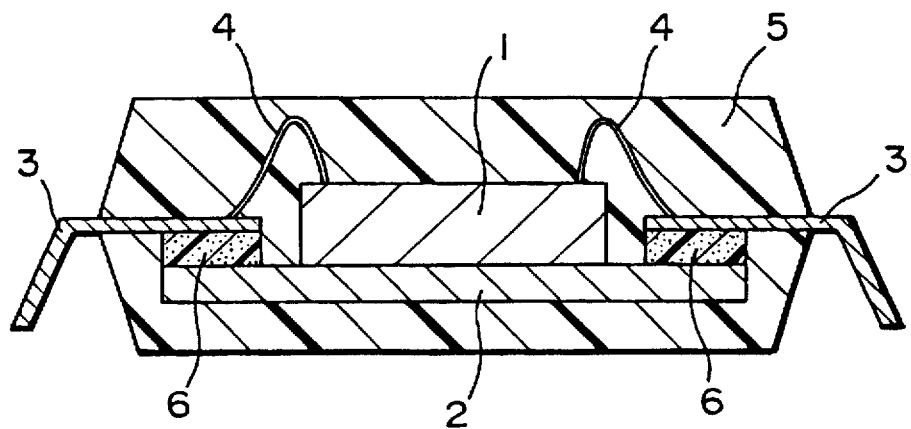
FIG. 1 is a cross-sectional view of one embodiment of a resin-molded type semiconductor device using an adhesive tape of the present invention or a conventional adhesive tape.
Figure 2:
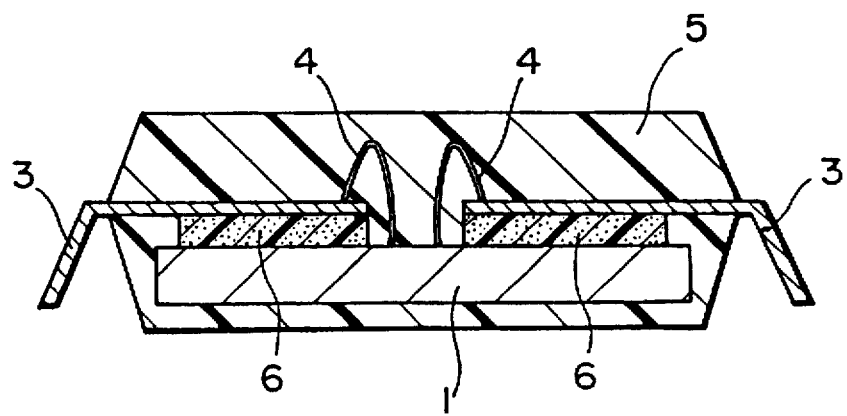
FIG. 2 is a cross-sectional view of another embodiment of a resin-molded type semiconductor device using an adhesive tape of the present invention or a conventional adhesive tape.
Figure 3:
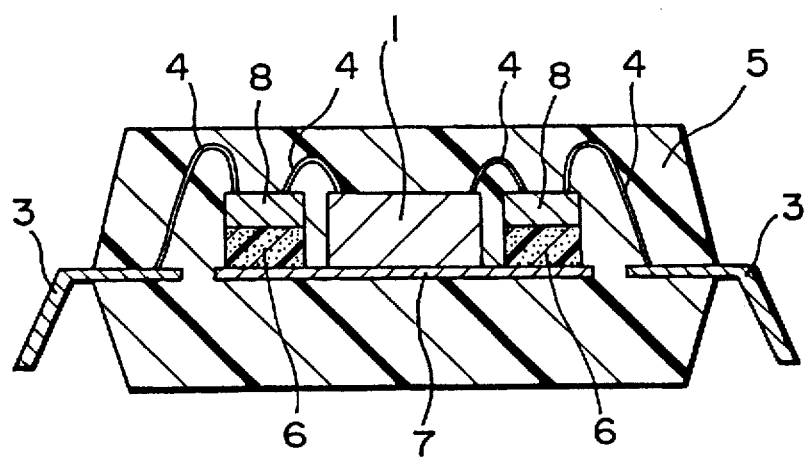
FIG. 3 is a cross-sectional view of still another embodiment of a resin-molded type semiconductor device using an adhesive tape of the present invention or a conventional adhesive tape.

The embodiments of the present invention will now be described in detail.

The polyimide which can be used in the adhesive tape and the liquid adhesive for electric parts of the present invention contains at least a polyimide selected from the above mentioned polyimides (I)–(III), which have a bissuccinimide structure. In the present invention, these polyimides may be used as a mixture of two or more of them.

The first polyimide (I) used in the present invention is that containing the following formula (1) as the repeating unit.

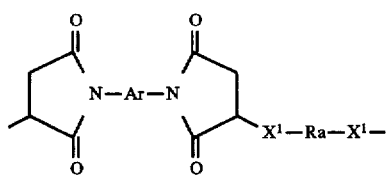
(1)

wherein Ar, Ra and $X^1$ have each the same meaning as described above.

The second polyimide (II) used in the present invention is that containing the following formula (2) as the repeating unit.

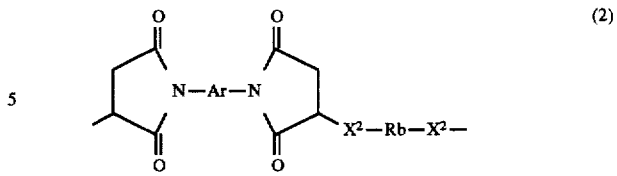
(2)

wherein Ar, Rb and $X^2$ have each the same meaning as described above.

The second polyimide (II) has a lower glass transition point than the first polyimide (I), by which the temperature capable of adhering the adhesive is lower.

The third polyimide (III) comprises the repeating units represented by the above formulas (1) and (2) in a suitable proportion. In the third polyimide (III), it is possible to lower the glass transition point by increasing the proportion of the repeating unit represented by the formula (2).

The first to third polyimides described above can be produced according to conventional Michael's addition polymerization reaction of maleimide. Accordingly, they can be produced from a bismaleimide corresponding to each repeating unit and a diamine or dithiol corresponding to each repeating unit.

The first polyimide (I) used in the present invention can be produced by reacting a bismaleimide represented by the following formula (5) with a compound represented by the following formula (6) in a presence of active hydrogen:

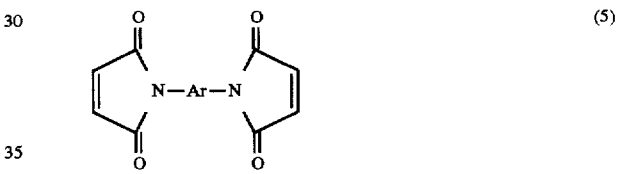
(5)

wherein Ar has the same meaning as described above.

$$HX^1—Ra—X^1H \quad (6)$$

wherein Ra and $X^1$ have each the same meaning as described above.

The second polyimide (II) used in the present invention can be produced by reacting a bismaleimide represented by the above formula (5) with a compound represented by the following formula (7) in a presence of active hydrogen:

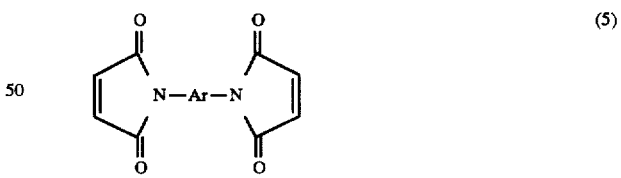
(5)

wherein Ar has the same meaning as described above.

$$HX^2—Rb—X^2H \quad (7)$$

wherein Rb and $X^2$ have each the same meaning as described above.

The third polyimide (III) used in the present invention can be produced by reacting a bismaleimide represented by the above formula (5) with a compound represented by the above formula (6) and a compound represented by the above formula (7) in a presence of active hydrogen.

The bismaleimide represented by the following formula (5) is a compound having two maleimide group in the molecule, wherein Ar is represented by the above formula (3) or the formula (4)

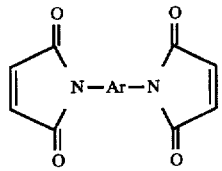

wherein Ar is the same meaning as described above.

In the polyimide used in the present invention, the bismaleimide represented by the formula (5) which composes the basic structural unit of the polyimide includes the followings. Examples of bismaleimide wherein Ar is represented by the formula (3) include 4,4'-bis(3-maleimidophenoxy)diphenyl ether, 4,4'-bis(3-maleimidophenoxy)benzophenone, 4,4'-bis(3-maleimidophenoxy)diphenyl sulfide, 4,4'-bis(3-maleimidophenoxy)diphenyl sulfone, 2,2'-bis(p-maleimidophenoxyphenyl)propane, and the like.

Examples of bismaleimide wherein Ar is represented by the formula (4) include bis(4-maleimide-2,5-dimethylphenyl)methane, bis(4-maleimide-2,5-diethylphenyl)methane, bis(4-maleimide-2,5-dipropylphenyl)methane, bis(4-maleimide-2,5-diisopropylphenyl)methane, bis(4-maleimide-2,5-dibutylphenyl)methane, bis(4-maleimide-2-methyl-5-ethylphenyl)methane, bis(4-maleimide-2,5-dimethoxyphenyl)methane, bis(4-maleimide-2,5-diethoxyphenyl)methane, bis(4-maleimide-2,5-dipropoxyphenyl)methane, bis(4-maleimide-2,5-diisopropoxyphenyl)methane, bis(4-maleimide-2,5-dibutoxyphenyl)methane, bis(4-maleimide-2-methoxy-5-ethoxyphenyl)methane, and the like.

In the polyimide used in the present invention, the compound represented by the following formula (6) which composes the other basic structural unit of the polyimide includes diamines having amino groups in both terminals and dithiols having mercapto groups in both terminals.

$$HX^1-Ra-X^1H \tag{6}$$

wherein Ra and $X^1$ have each the same meaning as described above.

In the polyimide synthesized using the compound represented by the formula (6), it is preferred for enhancing the solubility in solvents that Ra in the formula (6) is a group having two or more benzene rings which are connected via —O—, —S—, —CH$_2$—, —C(C=O)—, —CONH—, —COO—, —SO$_2$—, —C(CH$_3$)$_2$—, —C(CF$_3$)$_2$—, etc. in straight form and in the meta or para position. The hydrogen atoms on each benzene rings of these compounds may optionally be substituted with suitable substituents.

The diamine compounds represented by the formula (6) having amino groups in both terminals include primary amines wherein $X^1$ is NH and secondary amines wherein $X^1$ is NR (R is an alkyl group having 1 to 4 carbon atoms.).

Examples of the primary amines represented by the formula (6) include 3,4'-oxydianiline, 4,4'-oxydianiline, 4,4'-diaminodiphenylmethane, 3,4'-diaminodiphenylmethane, 3,3'-diaminodiphenylmethane, 4,4'-diamino-3,3'-dimethyldiphenylmethane, 4,4'-diamino-3,3'-diethyldiphenylmethane, 4,4'-diamino-3,3'-dimethoxydiphenylmethane, 4,4'-diamino-3,3'-diethoxydiphenylmethane, 4,4'-diaminobenzanilide, 4,4'-diaminobenzophenone, 3,3'-diaminobenzophenone, 4,4'-diaminodiphenyl sulfone, 3,3'-diaminodiphenyl sulfone, 4,4'-(isopropylidene)dianiline, 3,3'-(isopropylidene)dianiline, bis[2-(4-aminophenyl)propane]benzene, bis(aminophenoxy)benzene, bis(aminophenoxy)biphenyl, bis(aminophenoxy)diphenyl ether, bis(aminophenoxyphenyl)propane, bis(aminophenoxyphenyl)-sulfone, bis(aminophenoxyphenyl)ketone, bis(aminophenoxyphenyl)hexafluoropropane, bis(aminophenoxyphenyl)biphenyl, bis(aminophenoxyphenyl)-diphenyl ether, 4,4'-bis[3-(4-amino-α, α'-dimethylbenzyl)phenoxy]diphenyl sulfone, 4,4'-bis[3-(4-amino-α, α'-dimethylbenzyl)phenoxy]benzophenone, 4,4'-bis[4-(4-amino-α, α'-dimethylbenzyl)phenoxy]diphenyl sulfone,4,4'-bis[4-(4-amino-α, α'-dimethylbenzyl)-benzophenone, 9,9-bis(4-aminophenyl)fluorene, and the like, which may be used as a mixture of them.

Examples of the secondary diamines represented by the formula (6) wherein the functional group: $X^1$ is NR include 4,4'-di(N-methylamino)diphenylmethane, 3,4'-di(N-methylamino)diphenylmethane, 4,4'-di(N-methylamino)diphenyl ether, 3,4'-di(N-methylamino)diphenyl ether, 4,4'-di(N-methylamino)benzanilide, 4,4'-di(N-methylamino)benzophenone, 3,3'-di(N-methylamino)benzophenone, and the like.

Examples of dithiols represented by the formula (6) wherein $X^1$ is a mercapto group include 3,4'-dimercaptodiphenyl ether, 4,4'-dimercaptodiphenyl ether, and compounds exemplified in the above mentioned primary diamines in which "amino" is replaced by "mercapto" or "amino" is replaced by "thiol".

In the polyimide used in the present invention, the compound represented by the following formula (7) which composes the other basic structural unit of the polyimide includes diamines having amino groups in both terminals and dithiols having mercapto groups in both terminals.

$$HX^2-Rb-X^2H \tag{7}$$

wherein Rb and $X^2$ have each the same meaning as described above.

The diamine compounds represented by the formula (7) having amino groups in both terminals include primary diamines wherein $X^2$ is NH, secondary diamines wherein $X^2$ is NR (R is an alkyl group having 1 to 4 carbon atoms.), and cyclic secondary diamines.

Examples of the primary diamines include ethylenediamine, propylenediamine, 1,4-diaminobutane, hexamethylenediamine, octamethylenediamine, decamethylenediamine, hexadecamethylenediamine, dodecamethylenediamine, di(aminoethyl)ether, 1,8-diamino-3,6-dioxaoctane, 1,11-diamino-3,6,9-trioxaundecane, 1,3-bis (3-aminopropyl)-1,1,3,3-tetramethyldisiloxane, 1,3-bis(10-aminodecyl)-1,1,3,3-tetramethyldisiloxane, 1,3-bis(3-aminophenoxymethyl)-1,1,3,3-tetramethyldisiloxane and α, ω-bis (3-aminopropyl) polydimethylsiloxane represented by the following formula:

$$H_2NCH_2CH_2CH_2[Si(CH_3)_2O]_nSi(CH_3)_2CH_2CH_2CH_2NH_2$$

wherein n is 3 or 7.

Examples of the secondary diamines wherein the functional group $X^2$ is NR include N,N'-dimethylethylenediamine, N,N'-dimethylpropylenediamine, N,N'-dimethyl-1,4-diaminobutane, N,N'-dimethylhexamethylenediamine, N,N'-dimethyloctamethylenediamine, N,N'-dimethyldecamethylenediamine, N,N'-dimethylhexadecamethylenediamine, N,N'-dimethyldodecamethylenediamine, and the like.

Examples of cyclic secondary diamines include 1,3-4-piperidyl)propane, 1,4-di(4-piperidyl)butane, 1,6-di(4- piperidyl)hexane, 1,8-di(4-piperidyl)octane, 1,10-di(4-piperidyl)decane, and the like.

Examples of dithiols of the compounds represented by the formula (7) wherein $X^1$ is a mercapto group include compounds exemplified in the above mentioned primary diamines and secondary diamines in which "amino" is replaced by "mercapto" or "amino" is replaced by "thiol"

The polyimides of the present invention can be produced as follows.

The polyimides used in the present invention can be produced by reacting a bismaleimide with a diamine, a dithiol or a mixture of them in an organic solvent in the presence of, if necessary, a tertiary amine catalyst such as tributylamine or triethylamine at a temperature in a range of from $-10°$ to $200°$ C., preferably from $0°$ to $130°$ C. for 1 to 48 hours. In the case that the diamine or the dithiol is an aliphatic compound represented by the formula (7), the reaction is preferably to be carried out at a relatively low temperature as low as $0°$–$50°$ C., because the aliphatic diamine or the like has a high reactivity with the maleimide compound.

Examples of the organic solvents used in the above mentioned reaction include protonic phenol solvents such as phenol, cresol, xylenol, and p-chlorophenol, and aprotic polar solvents such as N-methyl-2-pyrrolidone, N,N-dimethylacetamide, N,N-dimethylformamide, dimethylsulfoxide, sulforane, hexamethylphosphoric acid triamide, and 1,3-dimethyl-2-imidazolidone, to which 1–100 parts by weight of acid such as acetic acid, propionic acid, butyric acid, isobutyric acid, valeric acid, hexanoic acid, benzoic acid, p-toluenesulfonic acid, camphor sulfonic acid, etc. to 100 parts by weight of the aprotic polar solvent. When the above solvent having active hydrogens is not present in the reaction mixture, the reaction of the bismaleimide can not be controlled to result in producing only insoluble polyimides, whereby the object of the present invention can not be attained.

Optionally, solvents such as benzene, toluene, xylene, methyl ethyl ketone, acetone, tetrahydrofuran, dioxane, monoglyme, diglyme, methyl cellosolve, cellosolve acetate, methanol, ethanol, isopropanol, methylene chloride, chloroform, trichloroethylene and nitrobenzene can be mixed with the above-mentioned solvents as a mixture.

Upon production of the polyimide used in the present invention, a polyimide having a high polymerization degree can be produced by the reaction between equimolar amounts of the bismaleimide and the diamine or dithiol. If necessary, the molar ratio of bismaleimide to diamine or dithiol can be varied in a range of from 11:10 to 10:11, by which the polyimide can be produced.

The polyimide used in the present invention are soluble in various organic solvents such as aprotic polar solvents, e.g., N-methyl-2-pyrrolidone, N,N-dimethylacetamide, N,N-dimethylformamide, dimethylsulfoxide, sulforane, hexamethylphosphoric acid triamide, and 1,3-dimethyl-2-imidazolidone, phenol solvents such as phenol, cresol, xylenol and p-chlorophenol, etc., isophorone, cyclohexanone, carbitol acetate, diglyme, dioxane, tetrahydrofuran, etc. Also the polyimide is excellent in low-temperature moldability because of having a low glass transition point, and it withstands temperature as high as $200°$ C.

Since the film formability depends upon molecular weight of the above polyimides (I), (II) and (III) used in the present invention, the molecular weight can be optimally decided according to desired film formability. When being used in the present invention, polyimide having too low molecular weight is not preferred because film formability in some degree is required in the adhesive layer even in the case of the liquid form and the heat resistance is also lowered. In the present invention, the number average molecular weight of all of the polyimides (I)–(III) is required to be not less than 2,000. When being used as a thermoplasitic adhesive, the adhesion is changed for the worse, if the viscosity during the melting is too high. The molecular weight is a factor for controlling the viscosity during the melting. In the case of the polyimides (I)–(III) used in the present invention, the number average molecular weight is approximately not more than 400,000. If the molecular weight is higher than this value, there is a high increase in the viscosity making it difficult to be used as an adhesive.

The liquid adhesive of the present invention is produced by dissolving at least one selected from the above mentioned polyimides in an organic solvent. Examples of the organic solvents used for dissolving the polyimide include various organic solvents such as aprotic polar solvents, e.g., N-methyl-2-pyrrolidone, N,N-dimethylacetamide, N,N-dimethylformamide, dimethylsulfoxide, sulforane, hexamethylphosphoric acid triamide, and 1,3-dimethyl-2-imidazolidone, phenol solvents such as phenol, cresol, xylenol and p-chlorophenol, etc., isophorone, cyclohexanone, carbitol acetate, diglyme, dioxane, tetrahydrofuran, etc. Moreover, alcoholic solvents such as methanol, ethanol and isopropanol, ester solvents such as methyl acetate, ethyl acetate and butyl acetate, nitrile solvents such as acetonitrile and benzonitrile, aromatic solvents such as benzene, toluene and xylene, halogen solvents such as chloroform and dichloromethane, and the like can be mixed and used in such a degree that the polyimide is not separated.

Since the required viscosity and volatility change depending upon the process for applying the liquid adhesive and the base to be applied, the solvent for the liquid adhesive of the present invention can be optimally selected from the above solvents according to the applications.

In the liquid adhesive of the present invention, a filler having a particle size of not more than 1 µm may be incorporated for the purpose of controlling the characteristics during the adhering. The content of the filler when being incorporated is preferably from 1 to 50% by weight, and more preferably from 4 to 25% by weight, based on the total solid content. If the content of the filler exceeds 50% by weight, the adhesion strength is remarkably lowered. Conversely, if it is less than 1% by weight, no effect of the addition of the filler can be obtained.

Examples of the fillers which can be used are silica, quarts powder, mica, alumina, diamond powder, zircon powder, calcium carbonate, magnesium oxide, fluorine containing resin, and the like.

The adhesive tapes for electronic parts according to the first and the second aspects of the present invention can be produced by using the above liquid adhesive. The adhesive tape of the first aspect is produced by applying the liquid adhesive of the present invention to one side or both sides of a heat resistant film, followed by drying the resultant laminate. The adhesive tape of the second aspect is produced by applying the liquid adhesive of the present invention to one side of a release film, followed by drying the resultant laminate.

Examples of the heat resistant films include films made of polyimide, polyphenylene sulfide, polyether, polyparabanic acid and polyethylene terephthalate, etc., and composite heat resistant films such as epoxy resin/glass cloth, epoxy resin/polyimide/glass cloth, and polyimide film is particularly preferred.

The heat resistant film which is preferably used has a thickness of from 5 to 150 µm, and more preferably from 10 to 75 µm. If the thickness of the heat resistant film is too thick, the operation of punching the adhesive film becomes difficult. Conversely, it it is too thin, the rigidity of the film becomes insufficient.

The release film used in the present invention serves as a temporary base, which has a thickness of from 1 to 200 µm. Typical examples of the release film used include resin films made of polyethylene, polypropylene, fluorine containing resin, polyethylene terephthalate, polyimide, etc. and paper, and those the surface of which is subjected to releasing treatment with a silicone releasing agent.

The adhesive layer formed on a side or both sides of the above-mentioned heat resistant film or on a side of the release film may have a thickness in a range of from 1 µm to 100 µm and preferably from 5 µm to 50 µm.

In each adhesive tape of the present invention, it is possible to provide on the formed adhesive layer the above-mentioned release film as a protective layer.

As be clear from the results of examination shown hereafter, the liquid adhesive and the adhesive tape for electronic parts of the present invention have sufficient heat resistance and reliability. The liquid adhesive of the present invention can be suitably be used for adhering between parts around leadframes making up a semiconductor device, for example, lead pins, semiconductor-mounted substrate, heat spreader, and semiconductor chips themselves, and the adhesive tape for electronic parts of the present invention can suitably be used as an adhesive tape for the innerlead fix of the leadframe and a TAB tape, e.g.

EXAMPLE

The present invention will now be described in greater detail. First, examples for producing the liquid adhesive are shown.

Example 1

Into a flask equipped with a stirrer were introduced 28.53 g (50 mmol) of 2,2-bis(p-maleimidophenoxyphenyl) propane, 7.21 g (50 mmol) of octamethylenediamine and 250 ml of m-cresol at room temperature, and stirring was continued for 6 hour. The resultant polyimide varnish was poured into methanol, followed by separation of the resulting precipitate, pulverization, washing, and drying to obtain 34.0 g (yield:95%) of a polyimide having the repeating unit represented by the formula (2).

The IR spectrum measurement of the resultant polyimide showed typical absorption bands of succinimide at 1715 $cm^{-1}$ and 1785 $cm^{-1}$, and absorption band at 690 $cm^{-1}$ assigned to the double bond of maleimide disappeared. The molecular weight, glass transition point and temperature of initiating thermal decomposition of the polyimide were determined. The results are shown in Table 1.

The resultant polyimide was dissolved in tetrahydrofuran so as to be the concentration of 20% by weight to produce a liquid adhesive.

Example 2

Using 28.53 g (50 mmol) of 2,2-bis(p-maleimidophenoxyphenyl)propane, 7.21 g (50 mmol) of N,N'-dimethylhexamethylenediamine and 250 ml of m-cresol, a polyimide having the repeating unit represented by the formula (2) was obtained in an amount of 33.0 g (yield:92%) by the same manner as in Example 1.

The IR spectrum measurement of the resultant polyimide showed typical absorption bands of succinimide at 1715 $cm^{-1}$ and 1785 $cm^{-1}$ and absorption band at 690 $cm^{-1}$ assigned to the double bond of maleimide disappeared. The molecular weight, glass transition point and temperature of initiating thermal decomposition of the polyimide were determined. The results are shown in Table 1.

The resultant polyimide was dissolved in tetrahydrofuran so as to be the concentration of 20% by weight to produce a liquid adhesive.

Example 3

Using 28.53 g (50 mmol) of 2,2-bis(p-maleimidophenoxyphenyl)propane, 9.32 g (50 mmol) of 1,3-di(4-piperidyl)propane and 250 ml of m-cresol, a polyimide having the repeating unit represented by the formula (2) was obtained in an amount of 35.0 g (yield:92%) by the same manner as in Example 1.

The IR spectrum measurement of the resultant polyimide showed typical absorption bands of succinimide at 1710 $cm^{-1}$ and 1780 $cm^{-1}$, and absorption band at 690 $cm^{-1}$ assigned to the double bond of maleimide disappeared. The molecular weight, glass transition point and temperature of initiating thermal decomposition of the polyimide were determined. The results are shown in Table 1.

The resultant polyimide was dissolved in tetrahydrofuran so as to be the concentration of 20% by weight to produce a liquid adhesive.

Example 4

Using 28.53 g (50 mmol) of 2,2-bis(p-maleimidophenoxyphenyl)propane, 8.62 g (50 mmol) of 1,10-diaminodecane and 250 ml of m-cresol, a polyimide having the repeating unit represented by the formula (2) was obtained in an amount of 35.0 g (yield:94%) by the same manner as in Example 1.

The IR spectrum measurement of the resultant polyimide showed typical absorption bands of succinimide at 1715 $cm^{-1}$ and 1785 $cm^{-1}$, and absorption band at 690 $cm^{-1}$ assigned to the double bond of maleimide disappeared. The molecular weight, glass transition point and temperature of initiating thermal decomposition of the polyimide were determined. The results are shown in Table 1.

The resultant polyimide was dissolved in tetrahydrofuran so as to be the concentration of 20% by weight to produce a liquid adhesive.

Example 5

Using 28.53 g (50 mmol) of 2,2-bis(p-maleimidophenoxyphenyl)propane, 12.43 g (50 mmol) of 1,3-bis(3-aminopropyl)- 1,1,3,3-tetramethyldisiloxane and 250 ml of m-cresol, a polyimide having the repeating unit represented by the formula (2) was obtained in an amount of 40.0 g (yield:98%) by the same manner as in Example 1.

The IR spectrum measurement of the resultant polyimide showed typical absorption bands of succinimide at 1717 $cm^{-1}$ and 1785 $cm^{-1}$, and absorption band at 690 $cm^{-1}$ assigned to the double bond of maleimide disappeared. The molecular weight, glass transition point and temperature of initiating thermal decomposition of the polyimide were determined. The results are shown in Table 1.

The resultant polyimide was dissolved in tetrahydrofuran so as to be the concentration of 20% by weight to produce a liquid adhesive.

Example 6

Using 28.53 g (50 mmol) of 2,2-bis(p-maleimidophenoxyphenyl)propane, 9.11 g (50 mmol) of 1,8-dimercapto-3,5-dioxaoctane, 250 ml of m-cresol, and 1 ml of triethylamine as a catalyst, a polyimide having the repeating unit represented by the formula (2) was obtained in an amount of 37.0 g (yield:98%) by the same manner as in Example 1.

The IR spectrum measurement of the resultant polyimide showed typical absorption bands of succinimide at 1715 cm$^{-1}$ and 1785 cm$^{-1}$, and absorption band at 690 cm$^{-1}$ assigned to the double bond of maleimide disappeared. The molecular weight, glass transition point and temperature of initiating thermal decomposition of the polyimide were determined. The results are shown in Table 1.

The resultant polyimide was dissolved in tetrahydrofuran so as to be the concentration of 20% by weight to produce a liquid adhesive.

Example 7

Using 28.53 g (50 mmol) of 2,2-bis(p-maleimidophenoxyphenyl)propane, 7.51 g (50 mmol) of 1,6-dimercaptohexane, 250 ml of m-cresol and 1 ml of triethylamine as a catalyst, a polyimide having the repeating unit represented by the formula (2) was obtained in an amount of 35.6 g (yield:99%) by the same manner as in Example 1.

The IR spectrum measurement of the resultant polyimide showed typical absorption bands of succinimide at 1715 cm$^{-1}$ and 1785 cm$^{-1}$, and absorption band at 690 cm$^{-1}$ assigned to the double bond of maleimide disappeared. The molecular weight, glass transition point and temperature of initiating thermal decomposition of the polyimide were determined. The results are shown in Table 1.

The resultant polyimide was dissolved in tetrahydrofuran so as to be the concentration of 20% by weight to produce a liquid adhesive.

Example 8

Using 22.12 g (50 mmol) of bis(4-maleimido-2-ethyl-5-methylphenyl)methane, 7.21 g (50 mmol) of octamethylenediamine and 250 ml of m-cresol, a polyimide having the repeating unit represented by the formula (2) was obtained in an amount of 28.0 g (yield: 95%) by the same manner as in Example 1.

The IR spectrum measurement of the resultant polyimide showed typical absorption bands of succinimide at 1715 cm$^{-1}$ and 1715 cm$^{-1}$, and absorption band at 690 cm$^{-1}$ assigned to the double bond of maleimide disappeared. The molecular weight, glass transition point and temperature of initiating thermal decomposition of the polyimide were determined. The results are shown in Table 1.

The resultant polyimide was dissolved in tetrahydrofuran so as to be the concentration of 20% by weight to produce a liquid adhesive.

Example 9

Using 22.12 g (50 mmol) of bis(4-maleimido-2-ethyl-5-methylphenyl)methane, 7.21 g (50 mmol) of N,N'-dimethylhexamethylenediamine and 250 ml of m-cresol, a polyimide having the repeating unit represented by the formula (2) was obtained in an amount of 25.0 g (yield:85%) by the same manner as in Example 1.

The IR spectrum measurement of the resultant polyimide showed typical absorption bands of succinimide at 1716 cm$^{-1}$ and 1785 cm$^{-1}$, and absorption band at 690 cm$^{-1}$ assigned to the double bond of maleimide disappeared. The molecular weight, glass transition point and temperature of initiating thermal decomposition of the polyimide were determined. The results are shown in Table 1.

The resultant polyimide was dissolved in tetrahydrofuran so as to be the concentration of 20% by weight to produce a liquid adhesive.

Example 10

Using 22.12 g (50 mmol) of bis(4-maleimido-2-ethyl-5-methylphenyl)methane, 9.32 g (50 mmol) of 1,3-di(4-piperidyl)propane and 250 ml of m-cresol, a polyimide having the repeating unit represented by the formula (2) was obtained in an amount of 30.0 g (yield:95%) by the same manner as in Example 1.

The IR spectrum measurement of the resultant polyimide showed typical absorption bands of succinimide at 1710 cm$^{-1}$ and 1780 cm$^{-1}$, and absorption band at 690 cm$^{-1}$ assigned to the double bond of maleimide disappeared. The molecular weight, glass transition point and temperature of initiating thermal decomposition of the polyimide were determined. The results are shown in Table 1.

The resultant polyimide was dissolved in tetrahydrofuran so as to be the concentration of 20% by weight to produce a liquid adhesive.

Example 11

Using 22.12 g (50 mmol) of bis(4-maleimido-2-ethyl-5-methylphenyl)methane, 8.62 g (50 mmol) of 1,10-diaminodecane and 250 ml of m-cresol, a polyimide having the repeating unit represented by the formula (2) was obtained in an amount of 28.0 g (yield:91%) by the same manner as in Example 1.

The IR spectrum measurement of the resultant polyimide showed typical absorption bands of succinimide at 1715 cm$^{-1}$ and 1785 cm$^{-1}$, and absorption band at 690 cm$^{-1}$ assigned to the double bond of maleimide disappeared. The molecular weight, glass transition point and temperature of initiating thermal decomposition of the polyimide were determined. The results are shown in Table 1.

The resultant polyimide was dissolved in tetrahydrofuran so as to be the concentration of 20% by weight to produce a liquid adhesive.

Example 12

Using 22.12 g (50 mmol) of bis(4-maleimido-2-ethyl-5-methylphenyl)methane, 12.43 g (50 mmol) of 1,3-bis(3-aminopropyl)-1,1,3,3-tetramethyldisiloxane and 250 ml of m-cresol, a polyimide having the repeating unit represented by the formula (2) was obtained in an amount of 32.0 g (yield:93% ) by the same manner as in Example 1.

The IR spectrum measurement of the resultant polyimide showed typical absorption bands of succinimide at 1715 cm$^{-1}$ and 1785 cm$^{-1}$, and absorption band at 690 cm$^{-1}$ assigned to the double bond of maleimide disappeared. The molecular weight, glass transition point and temperature of initiating thermal decomposition of the polyimide were determined. The results are shown in Table 1.

The resultant polyimide was dissolved in tetrahydrofuran so as to be the concentration of 20% by weight to produce a liquid adhesive.

Example 13

Using 22.12 g (50 mmol) of bis(4-maleimido-2-ethyl-5-methylphenyl)methane, 9.11 g (50 mmol) of 1,8-dimercapto-3,5-dioxaoctane, 250 ml of m-cresol and 1 ml of triethylamine as a catalyst, a polyimide having the repeating unit represented by the formula (2) was obtained in an amount of 30.0 g (yield:96%) by the same manner as in Example 1.

The IR spectrum measurement of the resultant polyimide showed typical absorption bands of succinimide at 1715 cm$^{-1}$ and 1785 cm$^{-1}$, and absorption band at 690 cm$^{-1}$ assigned to the double bond of maleimide disappeared. The molecular weight, glass transition point and temperature of initiating thermal decomposition of the polyimide were determined. The results are shown in Table 1.

The resultant polyimide was dissolved in tetrahydrofuran so as to be the concentration of 20% by weight to produce a liquid adhesive.

Example 14

Using 22.12 g (50 mmol) of bis(4-maleimido-2-ethyl-5-methylphenyl)methane, 7.51 g (50 mmol) of 1,6-dimercaptohexane, 250 ml of m-cresol and 1 ml of triethylamine as a catalyst, a polyimide having the repeating unit represented by the formula (2) was obtained in an amount of 28.0 g (yield:94%) by the same manner as in Example 1.

The IR spectrum measurement of the resultant polyimide showed typical absorption bands of succinimide at 1715 cm$^{-1}$ and 1785 cm$^{-1}$, and absorption band at 690 cm$^{-1}$ assigned to the double bond of maleimide disappeared. The molecular weight, glass transition point and temperature of initiating thermal decomposition of the polyimide were determined. The results are shown in Table 1.

The resultant polyimide was dissolved in tetrahydrofuran so as to be the concentration of 20% by weight to produce a liquid adhesive.

Solubility of the polyimides of Examples 1–14 in organic solvents was examined.

The solubility of these polyimides were confirmed by observing the state of the solving after 5% by weight solution was left standing for 12 hours at room temperature. As a result, the polyimides were soluble in solvents of N-methyl-2-pyrrolidone, N,N-dimethylacetamide, N,N-dimethylformamide, dimethylsulfoxide, sulforane, hexamethylphosphoric acid triamide, 1,3-dimethyl-2-imidazolidone, phenol, cresol, xylenol, p-chlorophenol, cyclohexanone, carbitol acetate, diglyme, dioxane, tetrahydrofuran and chloroform.

Example 15

A mixture of 28.53 g (50 mmol) of 2,2'-bis(p-maleimidophenoxyphenyl)propane, 10.01 g (50 mmol) of 3,4'-diaminodiphenyl ether and 250 ml of m-cresol was stirred at 100° C. for 6 hours. The resultant polyimide varnish was poured into methanol, followed by separation of the resulting precipitate, pulverization, washing, and drying to obtain 38.0 g (yield:99%) of a polyimide having the repeating unit represented by the formula (1).

The IR spectrum measurement of the resultant polyimide showed typical absorption bands of succinimide at 1705 cm$^{-1}$ and 1780 cm$^{-1}$, and absorption band at 690 cm$^{-1}$ assigned to the double bond of maleimide disappeared. The molecular weight, glass transition point and temperature of initiating thermal decomposition of the polyimide were determined. The results are shown in Table 1.

The resultant polyimide was dissolved in tetrahydrofuran so as to be the concentration of 20% by weight to produce a liquid adhesive.

Example 16

Using 28.53 g (50 mmol) of 2,2-bis(p-maleimidophenoxyphenyl)propane, 9.91 g (50 mmol) of 4,4'-diaminodiphenylmethane and 250 ml of m-cresol, a polyimide having the repeating unit represented by the formula (1) was obtained in an amount of 38.0 g (yield:99%) by the same manner as in Example 15.

The IR spectrum measurement of the resultant polyimide showed typical absorption bands of succinimide at 1705 cm$^{-1}$ and 1780 cm$^{-1}$, and absorption band at 690 cm$^{-1}$ assigned to the double bond of maleimide disappeared. The molecular weight, glass transition point and temperature of initiating thermal decomposition of the polyimide were determined. The results are shown in Table 1.

The resultant polyimide was dissolved in tetrahydrofuran so as to be the concentration of 20% by weight to produce a liquid adhesive.

Example 17

Using 28.53 g (50 mmol) of 2,2-bis(p-maleimidophenoxyphenyl)propane, 14.12 g (50 mmol) of di(4-amino-2-ethyl-5-methylphenyl)methane and 250 ml of m-cresol, a polyimide having the repeating unit represented by the formula (1) was obtained in an amount of 42.0 g (yield:98%) by the same manner as in Example 15.

The IR spectrum measurement of the resultant polyimide showed typical absorption bands of succinimide at 1705 cm$^{-1}$ and 1780 cm$^{-1}$, and absorption band at 690 cm$^{-1}$ assigned to the double bond of maleimide disappeared. The molecular weight, glass transition point and temperature of initiating thermal decomposition of the polyimide were determined. The results are shown in Table 1.

The resultant polyimide was dissolved in tetrahydrofuran so as to be the concentration of 20% by weight to produce a liquid adhesive.

Example 18

Using 28.53 g (50 mmol) of 2,2-bis(p-maleimidophenoxyphenyl)propane, 12.7 g (50 mmol) of di(4-amino-2,5-dimethylphenyl)methane and 250 ml of m-cresol, a polyimide having the repeating unit represented by the formula (1) was obtained in an amount of 41.0 g (yield:99%) by the same manner as in Example 15.

The IR spectrum measurement of the resultant polyimide showed typical absorption bands of succinimide at 1705 cm$^{-1}$ and 1780 cm$^{-1}$, and absorption band at 690 cm$^{-1}$ assigned to the double bond of maleimide disappeared. The molecular weight, glass transition point and temperature of initiating thermal decomposition of the polyimide were determined. The results are shown in Table 1.

The resultant polyimide was dissolved in tetrahydrofuran so as to be the concentration of 20% by weight to produce a liquid adhesive.

Example 19

Using 28.53 g (50 mmol) of 2,2-bis(p-maleimidophenoxyphenyl)propane, 15.5 g (50 mmol) of di(4-amino-2,5-diethylphenyl)methane and 250 ml of m-cresol, a polyimide having the repeating unit represented by the formula (1) was obtained in an amount of 44.0 g (yield:100%) by the same manner as in Example 15.

The IR spectrum measurement of the resultant polyimide showed typical absorption bands of succinimide at 1705 cm$^{-1}$ and 1780 cm$^{-1}$, and absorption band at 690 cm$^{-1}$ assigned to the double bond of maleimide disappeared. The molecular weight, glass transition point and temperature of initiating thermal decomposition of the polyimide were determined. The results are shown in Table 1.

15

The resultant polyimide was dissolved in tetrahydrofuran so as to be the concentration of 20% by weight to produce a liquid adhesive.

Example 20

Using 28.53 g (50 mmol) of 2,2-bis(p-maleimidophenoxyphenyl)propane, 12.42 g (50 mmol) of 4,4'-diaminodiphenyl sulfone and 250 ml of m-cresol, a polyimide having the repeating unit represented by the formula (1) was obtained in an amount of 34.0 g (yield:83%) by the same manner as in Example 15.

The IR spectrum measurement of the resultant polyimide showed typical absorption bands of succinimide at 1705 $cm^{-1}$ and 1780 $cm^{-1}$, and absorption band at 690 $cm^{-1}$ assigned to the double bond of maleimide disappeared. The molecular weight, glass transition point and temperature of initiating thermal decomposition of the polyimide were determined. The results are shown in Table 1.

The resultant polyimide was dissolved in tetrahydrofuran so as to be the concentration of 20% by weight to produce a liquid adhesive.

Example 21

Using 28.53 g (50 mmol) of 2,2-bis(p-maleimidophenoxyphenyl)propane, 11.37 g (50 mmol) of 4,4'-diaminobenzanilide and 250 ml of m-cresol, a polyimide having the repeating unit represented by the formula (1) was obtained in an amount of 39.5 g (yield:99%) by the same manner as in Example 15.

The IR spectrum measurement of the resultant polyimide showed typical absorption bands of succinimide at 1705 $cm^{-1}$ and 1780 $cm^{-1}$, and absorption band at 690 $cm^{-1}$ assigned to the double bond of maleimide disappeared. The molecular weight, glass transition point and temperature of initiating thermal decomposition of the polyimide were determined. The results are shown in Table 1.

The resultant polyimide was dissolved in tetrahydrofuran so as to be the concentration of 20% by weight to produce a liquid adhesive.

Example 22

Using 28.53 g (50 mmol) of 2,2-bis(p-maleimidophenoxyphenyl)propane, 20.53 g (50 mmol) of 2,2-bis[4-(4-aminophenoxy)phenyl]propane and 250 ml of m-cresol, a polyimide having the repeating unit represented by the formula (1) was obtained in an amount of 48.0 g (yield:98%) by the same manner as in Example 15.

The IR spectrum measurement of the resultant polyimide showed typical absorption bands of succinimide at 1705 $cm^{-1}$ and 1780 $cm^{-1}$, and absorption band at 690 $cm^{-1}$ assigned to the double bond of maleimide disappeared. The molecular weight, glass transition point and temperature of initiating thermal decomposition of the polyimide were determined. The results are shown in Table 1.

The resultant polyimide was dissolved in tetrahydrofuran so as to be the concentration of 20% by weight to produce a liquid adhesive.

Example 23

Using 28.53 g (50 mmol) of 2,2-bis(p-maleimidophenoxyphenyl)propane, 17.23 g (50 mmol) of 1,3-bis[2-(4-aminophenyl)isopropyl]benzene and 250 ml of m-cresol, a polyimide having the repeating unit represented by the formula (1) was obtained in an amount of 45.0 g (yield:98%) by the same manner as in Example 15.

The IR spectrum measurement of the resultant polyimide showed typical absorption bands of succinimide at 1705 $cm^{-1}$ and 1780 $cm^{-1}$, and absorption band at 690 $cm^{-1}$ assigned to the double bond of maleimide disappeared. The molecular weight, glass transition point and temperature of initiating thermal decomposition of the polyimide were determined. The results are shown in Table 1.

The resultant polyimide was dissolved in tetrahydrofuran so as to be the concentration of 20% by weight to produce a liquid adhesive.

Example 24

Using 28.53 g (50 mmol) of 2,2-bis(p-maleimidophenoxyphenyl)propane, 17.23 g (50 mmol) of 1,4-bis[2-(4-aminophenyl)isopropyl]benzene and 250 ml of m-cresol, a polyimide having the repeating unit represented by the formula (1) was obtained in an amount of 45.0 g (yield:98%) by the same manner as in Example 15.

The IR spectrum measurement of the resultant polyimide showed typical absorption bands of succinimide at 1705 $cm^{-1}$ and 1780 $cm^{-1}$, and absorption band at 690 $cm^{-1}$ assigned to the double bond of maleimide disappeared. The molecular weight, glass transition point and temperature of initiating thermal decomposition of the polyimide were determined. The results are shown in Table 1.

The resultant polyimide was dissolved in tetrahydrofuran so as to be the concentration of 20% by weight to produce a liquid adhesive.

Example 25

Using 28.53 g (50 mmol) of 2,2-bis(p-maleimidophenoxyphenyl)propane, 18.42 g (50 mmol) of 4,4'-bis(4-aminophenoxy)biphenyl and 250 ml of m-cresol, a polyimide having the repeating unit represented by the formula (1) was obtained in an amount of 46.0 g (yield:98%) by the same manner as in Example 15.

The IR spectrum measurement of the resultant polyimide showed typical absorption bands of succinimide at 1705 $cm^{-1}$ and 1780 $cm^{-1}$, and absorption band at 690 $cm^{-1}$ assigned to the double bond of maleimide disappeared. The molecular weight, glass transition point and temperature of initiating thermal decomposition of the polyimide were determined. The results are shown in Table 1.

The resultant polyimide was dissolved in tetrahydrofuran so as to be the concentration of 20% by weight to produce a liquid adhesive.

Example 26

Using 28.53 g (50 mmol) of 2,2-bis(p-maleimidophenoxyphenyl)propane, 14.62 g (50 mmol) of 1,4-bis(4-aminophenoxy)benzene and 250 ml of m-cresol, a polyimide having the repeating unit represented by the formula (1) was obtained in an amount of 43.0 g (yield:99%) by the same manner as in Example 15.

The IR spectrum measurement of the resultant polyimide showed typical absorption bands of succinimide at 1705 $cm^{-1}$ and 1780 $cm^{-1}$, and absorption band at 690 $cm^{-1}$ assigned to the double bond of maleimide disappeared. The molecular weight, glass transition point and temperature of initiating thermal decomposition of the polyimide were determined. The results are shown in Table 1.

The resultant polyimide was dissolved in tetrahydrofuran so as to be the concentration of 20% by weight to produce a liquid adhesive.

Example 27

Using 28.53 g (50 mmol) of 2,2-bis(p-maleimidophenoxyphenyl)propane, 14.62 g (50 mmol) of 1,3-bis(4-aminophenoxy)benzene and 250 ml of m-cresol, a polyimide having the repeating unit represented by the formula (1) was obtained in an amount of 45.0 g (yield:98%) by the same manner as in Example 15.

The IR spectrum measurement of the resultant polyimide showed typical absorption bands of succinimide at 1705 $cm^{-1}$ and 1780 $cm^{-1}$, and absorption band at 690 $cm^{-1}$ assigned to the double bond of maleimide disappeared. The molecular weight, glass transition point and temperature of initiating thermal decomposition of the polyimide were determined. The results are shown in Table 1.

The resultant polyimide was dissolved in tetrahydrofuran so as to be the concentration of 20% by weight to produce a liquid adhesive.

Example 28

Using 28.53 g (50 mmol) of 2,2-bis(p-maleimidophenoxyphenyl)propane, 8.71 g (50 mmol) of 9,9-bis(4-aminophenyl)fluorene and 250 ml of m-cresol, a polyimide having the repeating unit represented by the formula (1) was obtained in an amount of 37.0 g (yield:99%) by the same manner as in Example 15.

The IR spectrum measurement of the resultant polyimide showed typical absorption bands of succinimide at 1705 $cm^{-1}$ and 1780 $cm^{-1}$, and absorption band at 690 $cm^{-1}$ assigned to the double bond of maleimide disappeared. The molecular weight, glass transition point and temperature of initiating thermal decomposition of the polyimide were determined. The results are shown in Table 1.

The resultant polyimide was dissolved in tetrahydrofuran so as to be the concentration of 20% by weight to produce a liquid adhesive.

Example 29

Using 28.53 g (50 mmol) of 2,2-bis(p-maleimidophenoxyphenyl)propane, 12.22 g (50 mmol) of 3,3'-dimethoxy-4,4'-diaminobiphenyl and 250 ml of m-cresol, a polyimide having the repeating unit represented by the formula (1) was obtained in an amount of 38.0 g (yield:93%) by the same manner as in Example 15.

The IR spectrum measurement of the resultant polyimide showed typical absorption bands of succinimide at 1705 $cm^{-1}$ and 1780 $cm^{-1}$, and absorption band at 690 $cm^{-1}$ assigned to the double bond of maleimide disappeared. The molecular weight, glass transition point and temperature of initiating thermal decomposition of the polyimide were determined. The results are shown in Table 1.

The resultant polyimide was dissolved in tetrahydrofuran so as to be the concentration of 20% by weight to produce a liquid adhesive.

Example 30

Using 28.53 g (50 mmol) of 2,2-bis(p-maleimidophenoxyphenyl)propane, 10.62 g (50 mmol) of 3,3'-dimethyl-4,4'-diaminobiphenyl and 250 ml of m-cresol, a polyimide having the repeating unit represented by the formula (1) was obtained in an amount of 33.0 g (yield:84%) by the same manner as in Example 15.

The IR spectrum measurement of the resultant polyimide showed typical absorption bands of succinimide at 1705 $cm^{-1}$ and 1780 $cm^{-1}$, and absorption band at 690 $cm^{-1}$ assigned to the double bond of maleimide disappeared. The molecular weight, glass transition point and temperature of initiating thermal decomposition of the polyimide were determined. The results are shown in Table 1.

The resultant polyimide was dissolved in tetrahydrofuran so as to be the concentration of 20% by weight to produce a liquid adhesive.

Example 31

Using 28.53 g (50 mmol) of 2,2-bis(p-maleimidophenoxyphenyl)propane, 21.63 g (50 mmol) of bis[4-(4-aminophenoxy)phenyl]sulfone and 250 ml of m-cresol, a polyimide having the repeating unit represented by the formula (1) was obtained in an amount of 49.0 g (yield:97%) by the same manner as in Example 15.

The IR spectrum measurement of the resultant polyimide showed typical absorption bands of succinimide at 1705 $cm^{-1}$ and 1780 $cm^{-1}$, and absorption band at 690 $cm^{-1}$ assigned to the double bond of maleimide disappeared. The molecular weight, glass transition point and temperature of initiating thermal decomposition of the polyimide were determined. The results are shown in Table 1.

The resultant polyimide was dissolved in tetrahydrofuran so as to be the concentration of 20% by weight to produce a liquid adhesive.

Example 32

Using 28.53 g (50 mmol) of 2,2-bis(p-maleimidophenoxyphenyl)propane, 25.93 g (50 mmol) of 2,2-bis[4-(4-aminophenoxy)phenyl]hexafluoropropane and 250 ml of m-cresol, a polyimide having the repeating unit represented by the formula (1) was obtained in an amount of 52.0 g (yield:95%) by the same manner as in Example 15.

The IR spectrum measurement of the resultant polyimide showed typical absorption bands of succinimide at 1705 $cm^{-1}$ and 1780 $cm^{-1}$, and absorption band at 690 $cm^{-1}$ assigned to the double bond of maleimide disappeared. The molecular weight, glass transition point and temperature of initiating thermal decomposition of the polyimide were determined. The results are shown in Table 1.

The resultant polyimide was dissolved in tetrahydrofuran so as to be the concentration of 20% by weight to produce a liquid adhesive.

Example 33

Using 27.83 g (50 mmol) of 4,4'-bis(m-maleimidophenoxy)benzophenone, 20.53 g (50 mmol) of 2,2-bis[4-(4-aminophenoxy)phenyl]propane and 250 ml of m-cresol, a polyimide having the repeating unit represented by the formula (1) was obtained in an amount of 47.0 g (yield:97%) by the same manner as in Example 15.

The IR spectrum measurement of the resultant polyimide showed typical absorption bands of succinimide at 1718 $cm^{-1}$ and 1788 $cm^{-1}$, and absorption band at 690 $cm^{-1}$ assigned to the double bond of maleimide disappeared. The molecular weight, glass transition point and temperature of initiating thermal decomposition of the polyimide were determined. The results are shown in Table 1.

The resultant polyimide was dissolved in tetrahydrofuran so as to be a concentration of 20% by weight to produce a liquid adhesive.

Example 34

Using 28.03 g (50 mmol) of bis[4-(3-maleimidophenoxy)phenyl]propane, 20.53 g (50 mmol) of 2,2-bis[4-(4-aminophenoxy)phenyl]propane and 250 ml of m-cresol, a polyimide having the repeating unit represented by the formula (1) was obtained in an amount of 47.5 g (yield:98%) by the same manner as in Example 15.

The IR spectrum measurement of the resultant polyimide showed typical absorption bands of succinimide at 1720 cm$^{-1}$ and 1790 cm$^{-1}$, and absorption band at 690 cm$^{-1}$ assigned to the double bond of maleimide disappeared. The molecular weight, glass transition point and temperature of initiating thermal decomposition of the polyimide were determined. The results are shown in Table 1.

The resultant polyimide was dissolved in tetrahydrofuran so as to be the concentration of 20% by weight to produce a liquid adhesive.

Example 35

Using 29.63 g (50 mmol) of 4,4'-bis(m-maleimidophenoxy)benzophenone, 20.53 g (50 mmol) of 2,2-bis[4-(4-aminophenoxy)phenyl]propane and 250 ml of m-cresol, a polyimide having the repeating unit represented by the formula (1) was obtained in an amount of 49.0 g (yield:98%) by the same manner as in Example 15.

The IR spectrum measurement of the resultant polyimide showed typical absorption bands of succinimide at 1718 cm$^{-1}$ and 1788 cm$^{-1}$, and absorption band at 690 cm$^{-1}$ assigned to the double bond of maleimide disappeared. The molecular weight, glass transition point and temperature of initiating thermal decomposition of the polyimide were determined. The results are shown in Table 1.

The resultant polyimide was dissolved in tetrahydrofuran so as to be the concentration of 20% by weight to produce a liquid adhesive.

Solubility of the polyimides of Examples 15–35 in organic solvents was examined.

The solubility of these polyimides were confirmed by observing the state of the solving after 5% by weight solution was left standing for 12 hours at room temperature. As a result, the polyimides were soluble in solvents of N-methyl-2-pyrrolidone, N,N-dimethylacetamide, N,N-dimethylformamide, dimethylsulfoxide, sulforane, hexamethylphosphoric acid triamide, 1,3-dimethyl-2-imidazolidone, phenol, cresol, xylenol, p-chlorophenol, cyclohexanone, carbitol acetate, diglyme, dioxane, tetrahydrofuran and chloroform.

Example 36

28.53 g (50 mmol) of 2,2-bis(m-maleimidophenoxyphenyl)propane and 6.21 g (25 mmol) of 1,3-bis(3-aminopropyl)-1,1,3,3-tetramethyldisiloxane were introduced in 250 ml of m-cresol. After the mixture was allowed to react at room temperature for 4 hours, 10.26 g (25 mmol) of 2,2-bis(p-aminophenoxyphenyl)propane was added thereto to react at 100° C. for 4 hours. The resultant polyimide varnish was poured into methanol, followed by separation of the resulting precipitate, pulverization, washing, and drying to obtain 42.0 g (yield:93% ) of a polyimide having the repeating units represented by the formulas (1) and (2).

The IR spectrum measurement of the resultant polyimide showed typical absorption bands of succinimide at 1705 cm$^{-1}$ and 1780 cm$^{-1}$, and absorption band at 690 cm$^{-1}$ assigned to the double bond of maleimide disappeared. The molecular weight, glass transition point and temperature of initiating thermal decomposition of the polyimide were determined. The results are shown in Table 1.

The resultant polyimide was dissolved in tetrahydrofuran so as to be the concentration of 20% by weight to produce a liquid adhesive.

Example 37

28.53 g (50 mmol) of 2,2-bis(m-maleimidophenoxyphenyl)propane and 4.56 g (25 mmol) of 1,8-dimercapto-3,5-dioxaoctane were introduced in 250 ml of m-cresol. After the mixture was allowed to react at room temperature for 4 hours, 10.26 g (25 mmol) of 2,2-bis(p-aminophenoxyphenyl)propane was added thereto to react at 100° C. for 4 hours. The resultant polyimide varnish was poured into methanol, followed by separation of the resulting precipitate, pulverization, washing, and drying to obtain 41.0 g (yield:95%) of a polyimide having the repeating units represented by the formulas (1) and (2).

The IR spectrum measurement of the resultant polyimide showed typical absorption bands of succinimide at 1705 cm$^{-1}$ and 1780 cm$^{-1}$, and absorption band at 690 cm$^{-1}$ assigned to the double bond of maleimide disappeared. The molecular weight, glass transition point and temperature of initiating thermal decomposition of the polyimide were determined. The results are shown in Table 1.

The resultant polyimide was dissolved in tetrahydrofuran so as to be the concentration of 20% by weight to produce a liquid adhesive.

Example 38

28.53 g (50 mmol) of 2,2-bis(m-maleimidophenoxyphenyl)propane and 6.21 g (25 mmol) of 1,3-bis(3-aminopropyl)-1,1,3,3-tetramethyldisiloxane were introduced in 250 ml of m-cresol. After the mixture was allowed to react at room temperature for 4 hours, 4.96 g (25 mmol) of 4,4'-diaminodiphenylmethane was added thereto to react at 100° C. for 4 hours. The resultant polyimide varnish was poured into methanol, followed by separation of the resulting precipitate, pulverization, washing, and drying to obtain 37.0 g (yield:93% ) of a polyimide having the repeating units represented by the formulas (1) and (2).

The IR spectrum measurement of the resultant polyimide showed typical absorption bands of succinimide at 1705 cm$^{-1}$ and 1780 cm$^{-1}$, and absorption band at 690 cm$^{-1}$ assigned to the double bond of maleimide disappeared. The molecular weight, glass transition point and temperature of initiating thermal decomposition of the polyimide were determined. The results are shown in Table 1.

The resultant polyimide was dissolved in tetrahydrofuran so as to be the concentration of 20% by weight to produce a liquid adhesive.

Example 39

28.53 g (50 mmol) of 2,2-bis(m-maleimidophenoxyphenyl)propane and 4.56 g (25 mmol) of 1,8-dimercapto-3,5-dioxaoctane were introduced in 250 ml of m-cresol. After the mixture was allowed to react at room temperature for 4 hours, 4.96 g (25 mmol) of 4,4'-diaminodiphenylmethane was added thereto to react at 100° C. for 4 hours. The resultant polyimide varnish was poured into methanol, followed by separation of the resulting precipitate, pulverization, washing, and drying to obtain 36.0 g (yield:95%) of a polyimide having the repeating units represented by the formulas (1) and (2).

The IR spectrum measurement of the resultant polyimide showed typical absorption bands of succinimide at 1705 cm$^{-1}$ and 1780 cm$^{-1}$, and absorption band at 690 cm$^{-1}$ assigned to the double bond of maleimide disappeared. The molecular weight, glass transition point and temperature of initiating thermal decomposition of the polyimide were determined. The results are shown in Table 1.

The resultant polyimide was dissolved in tetrahydrofuran so as to be the concentration of 20% by weight to produce a liquid adhesive.

Solubility of the polyimides of Examples 36–39 in organic solvents was examined.

The solubility of these polyimides were confirmed by observing the state of the solving after 5% by weight solution was left standing for 12 hours at room temperature. As a result, the polyimides were soluble in solvents of N-methyl-2-pyrrolidone, N,N-dimethylacetamide, N,N-dimethylformamide, dimethylsulfoxide, sulforane, hexamethylphosphoric acid triamide, 1,3-dimethyl-2-imidazolidone, phenol, cresol, xylenol, p-chlorophenol, cyclohexanone, carbitol acetate, diglyme, dioxane, tetrahydrofuran and chloroform.

TABLE 1

|  | Number average molecular weight (×10⁴) | Glass transition point (°C.) | Temperature of initiating thermal decomposition (°C.) |
|---|---|---|---|
| Ex. 1 | 2.33 | 77 | 360 |
| Ex. 2 | 2.53 | 92 | 233 |
| Ex. 3 | 1.55 | 150 | 280 |
| Ex. 4 | 2.54 | 70 | 290 |
| Ex. 5 | 2.89 | 66 | 390 |
| Ex. 6 | 3.51 | 77 | 335 |
| Ex. 7 | 2.59 | 90 | 230 |
| Ex. 8 | 2.03 | 81 | 270 |
| Ex. 9 | 2.30 | 94 | 252 |
| Ex.10 | 1.22 | 158 | 280 |
| Ex.11 | 2.04 | 80 | 280 |
| Ex.12 | 2.22 | 75 | 280 |
| Ex.13 | 3.00 | 85 | 350 |
| Ex.14 | 2.89 | 100 | 230 |
| Ex.15 | 1.00 | 150 | 340 |
| Ex.16 | 3.57 | 151 | 334 |
| Ex.17 | 1.89 | 150 | 303 |
| Ex.18 | 2.56 | 160 | 300 |
| Ex.19 | 2.85 | 140 | 300 |
| Ex.20 | 1.08 | 130 | 290 |
| Ex.21 | 2.56 | 160 | 348 |
| Ex.22 | 3.64 | 190 | 356 |
| Ex.23 | 3.61 | 130 | 345 |
| Ex.24 | 3.28 | 160 | 350 |
| Ex.25 | 2.70 | 198 | 360 |
| Ex.26 | 2.89 | 192 | 314 |
| Ex.27 | 2.73 | 156 | 320 |
| Ex.28 | 2.29 | 202 | 362 |
| Ex.29 | 1.33 | 160 | 320 |
| Ex.30 | 2.01 | 160 | 330 |
| Ex.31 | 1.89 | 130 | 325 |
| Ex.32 | 2.56 | 160 | 320 |
| Ex.33 | 2.22 | 120 | 300 |
| Ex.34 | 2.34 | 120 | 270 |
| Ex.35 | 2.47 | 110 | 280 |
| Ex.36 | 5.01 | 142 | 243 |
| Ex.37 | 3.80 | 100 | 356 |
| Ex.38 | 4.39 | 124 | 356 |
| Ex.39 | 3.54 | 100 | 344 |

In the above Table 1, the measurement of the molecular weight of polyimides was carried out using tetrahydrofuran as an eluent and Shodex 80M×2 as a column. Value of the molecular weight is a number average molecular weight which is calculated as polystyrene. The glass transition point was determined by a differential thermal analysis (in a nitrogen atmosphere, heated at 10° C./min.) and the temperature of initiating thermal decomposition was determined by a thermogravimetry (in a nitrogen atmosphere, heated at 10° C./min.)

Example 40

A liquid adhesive was obtained by mixing 50 parts by weight of the liquid adhesive obtained in Example 5 with 50 parts by weight of the liquid adhesive obtained in Example 16.

Example 41

A liquid adhesive was obtained by mixing 50 parts by weight of the liquid adhesive obtained in Example 5 with 50 parts by weight of the liquid adhesive obtained in Example 22.

Example 42

A liquid adhesive was obtained by mixing 50 parts by weight of the liquid adhesive obtained in Example 5 with 50 parts by weight of the liquid adhesive obtained in Example 23.

Example 43

A liquid adhesive was obtained by mixing 60 parts by weight of the liquid adhesive obtained in Example 5 with 40 parts by weight of the liquid adhesive obtained in Example 26.

Example 44

A liquid adhesive was obtained by mixing 10 parts by weight of alumina filler (produced by Showa Denko; particle size: 0.05 μm) with 100 parts by weight of the liquid adhesive obtained in Example 5 to disperse therein.

Example 45

A liquid adhesive was obtained by mixing 10 parts by weight of alumina filler (produced by Showa Denko; particle size: 0.05 μm) with 100 parts by weight of the liquid adhesive obtained in Example 6 to disperse therein.

Example 46

A liquid adhesive was obtained by mixing 10 parts by weight of alumina filler (produced by Showa Denko; particle size: 0.05 μm) with 100 parts by weight of the liquid adhesive obtained in Example 22 to disperse therein.

Example 47

A liquid adhesive was obtained by mixing 10 parts by weight of silica filler (produced by Arakawa Kagaku Kogyo; particle size: 0.07 μm) with 100 parts by weight of the liquid adhesive obtained in Example 5 to disperse therein.

Example 48

A liquid adhesive was obtained by mixing 10 parts by weight of silica filler (produced by Arakawa Kagaku Kogyo; particle size: 0.07 μm) with 100 parts by weight of the liquid adhesive obtained in Example 6 to disperse therein.

Example 49

A liquid adhesive was obtained by mixing 10 parts by weight of silica filler (produced by Arakawa Kagaku Kogyo; particle size: 0.07 μm) with 100 parts by weight of the liquid adhesive obtained in Example 22 to disperse therein.

Example 50

A liquid adhesive was obtained by mixing 10 parts by weight of silica filler (produced by Arakawa Kagaku Kogyo; particle size: 0.07 μm) with 100 parts by weight of the liquid adhesive obtained in Example 27 to disperse therein.

TABLE 2

|   | Number average molecular weight (×10⁴) | Glass transition point (°C.) | Temperature of initiating thermal decomposition (°C.) |
|---|---|---|---|
| Ex.40 | — | 110 | 334 |
| Ex.41 | — | 130 | 356 |
| Ex.42 | — | 100 | 340 |
| Ex.43 | — | 135 | 340 |
| Ex.44 | 2.89 | 76 | 390 |
| Ex.45 | 3.51 | 84 | 335 |
| Ex.46 | 3.64 | 196 | 356 |
| Ex.47 | 2.89 | 76 | 390 |
| Ex.48 | 3.51 | 84 | 335 |
| Ex.49 | 3.64 | 197 | 356 |
| Ex.50 | 2.73 | 165 | 320 |

In the above table, measurements of each value were carried out by the same manner as described above. Since the symbol "—" means a mixture of two polyimides, the number average molerular weight is not shown in the table.

A nylon-epoxy adhesive (TORESINE FS-410, produced by Teikoku Kagaku Sangyo K. K.) (solid content: 20%; solvent isopropyl alcohol:methyl ethyl ketone=2:1) was prepared.

Comparative Example 2

A 20% by weight solution of polyimide varnish (Lark TPI, produced by MITSUI TOATSU CHEMICALS INC.) in N-methylpyrrolidone was prepared.

Production of Adhesive Tape

Each of the liquid adhesives obtained from Examples 1 to 50 was applied to both sides of a polyimide film so as to form an adhesive layer having a thickness of 20 μm, and dried in a hot air circulating oven at 150° C. for 5 minutes to produce an adhesive tape.

Production of Comparative Adhesive Tape 1

The liquid adhesive obtained from Comparative Example 1 was applied to both sides of a polyimide film so as to form an adhesive layer having a thickness of 20 μm, and dried in a hot air circulating oven at 150° C. for 15 minutes to produce an adhesive tape.

Production of Comparative Adhesive Tape 2

The liquid adhesive obtained from Comparative Example 2 was applied to both sides of a polyimide film so as to form an adhesive layer having a thickness of 20 μm, and dried in a hot air circulating oven at 150° C. for 120 minutes, and then 250° C. for 60 minutes to produce an adhesive tape.
(Assembling of Leadframe)

The leadframe used in a semiconductor package as shown in FIG. 1 was assembled according to the following procedures under conditions shown in the Table 3.

(a) Punch Die of Adhesive Tape

The adhesive tape was subjected to punch dying by mold.

(b) Pre-attachment of Adhesive Tape

A metal plane was placed on a hot plate, and the tape punched out in a ring form was pressed onto the plane by means of a metal rod to be pre-attached.

(c) Assembling of Leadframe

The metal plane to which the adhesive tape had been pre-attached in the above stage and a leadframe were positioned, and heated and pressed on a hot plate heated under conditions shown in Table 3 to adhere the leadframe and the plane via the adhesive tape.

(d) Curing of Adhesive Tape

In a hot-air circulating oven whose atmosphere was substituted by nitrogen, the comprative adhesive tape 1 was cured on the leadframe assembled in the above three stages under the conditions described in Table 3.

TABLE 3

|  | Name of Operation | | |
|---|---|---|---|
| Adhesive tape | Pre-attachment of Adhesive Tape | Assembling of Leadframe | Curing of Adhesive Tape |
| Adhesive Tapes 1 and 2 using adhesives of Examples 1–50 | 200° C./1 sec./ 4 kgf/cm² | Glass transition point of each resin + 80° C./1 sec./4 kgf/cm² | None |
| Comparative Adhesive tape 1 | 80° C./2 sec./ 4 kgf/cm² | 120° C./2 sec./ 4 kgf/cm² | 150° C./3 hrs. |
| Comparative Adhesive tape 2 | 350° C./10 sec./ 4 kgf/cm² | 350° C./15 sec./ 20 kgf/cm² | None |

(Assembling of Semiconductor Package)

Thereafter, the produced leadframe was used to assemble a package according to the following procedures. The reason why the conditions of curing were different at the time of assembling the leadframe is that the characteristics of the adhesives are different from each other. Here, optimum conditions for each adhesive were selected, and the adhesive was cured based on such conditions.

(a) Die Bonding

A semiconductor chip was adhered to a plane portion with a silver paste for die bonding, which was then cured at 150° C. for 2 hours.

(b) Wire Bonding

Using a wire bonder, a wire pad on the semiconductor chip and a silver plated portion at the end of the inner lead were connected with a gold wire.

(c) Molding

Using an epoxy molding compound, transfer molding was carried out.

(d) Finishing Stage

Via stages of forming, dum cutting, solder plating on the outer leads, etc., the packaging was finished. (The Results of Evaluations of Adhesive Tapes and Semiconductor Packages)

(a) Oxidization of Leadframe

The evaluation of whether or not the oxidization took place during curing the adhesive was visually determined by observing the color change on the surface of the leadframe.

As a result, since the Adhesive Tapes of the present invention could be taped at a low temperature, no oxidation occurred, but in the case of the Comparative Adhesive Tape 2 requiring a high adhesion temperature and a long time, the color change was observed, indicating that the leadframe was oxidized.

(b) Adhesion Strength

A 90° peel strength of 10 mm wide tape at room temperature was measured after the Adhesive Tape was adhered (taped) onto a copper plate under the condition shown in Table 3.

As a result, the Adhesive Tapes of the present invention were found to have a strength ranging from 35–50 g/10 mm, while the Comparative Adhesive Tape 1 had the strength of 2–4 g/10 mm, and that of the Comparative Adhesive Tape 2 had the strength of 10–40 g/10 mm, the last value having a large variation.

(c) Void

Whether or not the voids formed when the adhesive was cured was within the level problematic for a practical use was visually evaluated by means of a microscope.

As a result, in the Adhesive Tapes of the present invention, no void could be found, whereas in the Comparative Adhesive Tapes 1, formation of voids was found.

(d) Processability

Handlings (curl, feedability, etc.) when the adhesive tapes were used in order to assemble leadframes, and the surface tackiness of the adhesive tapes were evaluated.

As a result, the Adhesive Tapes of the present invention was found to have good handling abilities, and that no tacking occurred on the surfaces, but the Comparative Adhesive Tape 2 was found to be problematic in handling abilities.

(e) Wire Bondability

In the assembling of the package, the wire bondability onto the leadframe when wire bonding with the gold wire was determined.

As a result, in the case of using the Adhesive Tapes of the present invention, no bonding defect was observed in the tests for 832 pins. On the other hand, in the case of Comparative Adhesive Tape 1, bonding defects were observed in 123 of the 832 pins, indicating that the gold wire bonding could not be done with sufficient strength.

(f) Evaluation of Semiconductor Packages

The packages obtained as described above were tested using the PCBT Test (Pressure Cooker Biased Test). The test was carried out at 5 volts of applied voltage at 121° C., at 2 atmospheres and at 100% relative humidity. As a result, in the case of the Adhesive Tapes of present invention, no shorting took place even after 1,000 hours.

As is clear from the results described above, in the case of the adhesive tapes for electronic parts of the present invention, the semiconductor package can be produced in a good manner. In contrast, the adhesive tapes using adhesives of Comparative Examples are not suitable for manufacturing electronic parts, because there are problems in that oxidation of leadframe occurs, the conditions for adhering are not suitable for assembling the leadframe, and the wire bonding of gold wire cannot be carried out.

We claim:

1. An adhesive tape for electronic parts, which comprises an adhesive layer composed of at least a polyimide selected from (I) a polyimide comprising the repeating unit represented by the following formula (1), (II) a polyimide comprising the repeating unit represented by the following formula (2), and (III) a polyimide comprising the repeating units represented by the following formulas (1) and (2) in a suitable proportion, provided on at least one surface of a heat resistance film:

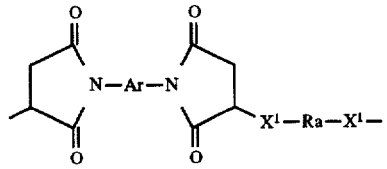

(1)

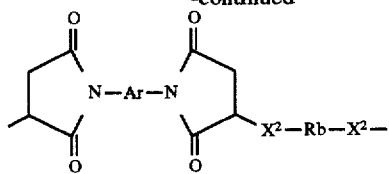

(2)

wherein Ar is a divalent group represented by the following formula (3) or the formula (4)

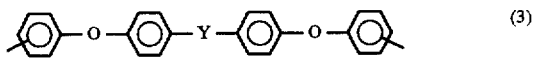

(3)

wherein Y is —O—, —CO—, —S—, —SO$_2$— or —C(CH$_3$)$_2$—,

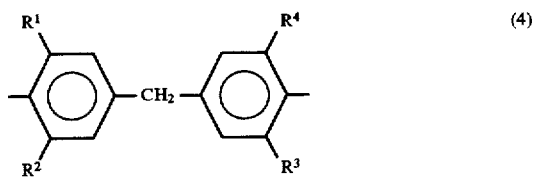

(4)

wherein R$^1$, R$^2$, R$^3$ and R$^4$ are each an alkyl group having 1 to 4 carbon atoms or an alkoxy group having 1 to 4 carbon atoms;

Ra represents a divalent group having 2 to 6 benzene rings;

Rb represents an alkylene group having 2 to 20 carbon atoms, an ether group:

—CH$_2$CH$_2$(OCH$_2$CH$_2$)$_n$— (wherein n is an integer of from 1 to 8), or a dimethylsiloxane group:

—R'—['Si(CH$_3$)$_2$O]$_m$Si(CH$_3$)$_2$—R'— (wherein R' is an alkyl group having 1 to 10 carbon atoms or —CH$_2$OC$_6$H$_4$— and m is an integer of 1 to 20);

X$^1$ is NH, NR (wherein R is an alkyl group having 1 to 4 carbon atoms or an alkoxy group having 1 to 4 carbon atoms) or S; and X$^2$ is NH, NR (wherein R is an alkyl group having 1 to 4 carbon atoms or an alkoxy group having 1 to 4 carbon atoms).

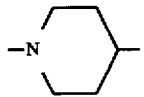

or S.

2. An adhesive tape for electronic parts as claimed in claim 1, wherein the heat resistant film is a polyimide film.

3. An adhesive tape for electronic parts as claimed in claim 1, wherein the adhesive layer contains a filler having a particle size of not more than 1 μm in an amount of from 1 to 50% by weight.

4. An adhesive tape for electronic parts, which comprises an adhesive layer composed of at least a polyimide selected from (I) a polyimide comprising the repeating unit represented by the following formula (1), (II) a polyimide comprising the repeating unit represented by the following formula (2), and (III) a polyimide comprising the repeating units represented by the following formulas (1) and (2) in a suitable proportion, provided on a surface of a release film:

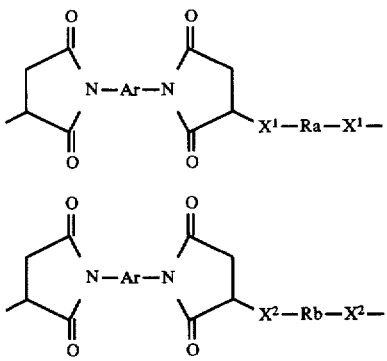
(1)

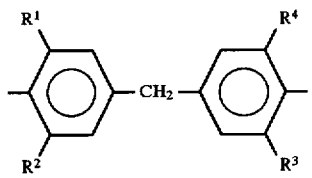
(2)

wherein Ar is a divalent group represented by the following formula (3) or the formula (4)

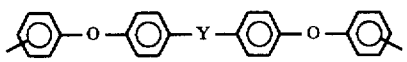
(3)

wherein Y is —O—, —CO—, —S—, —SO$_2$— or —C(CH$_3$)$_2$—,

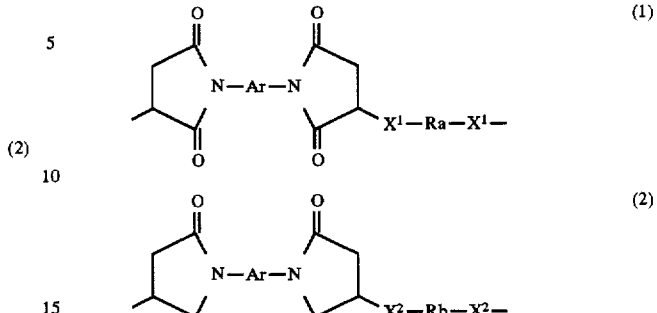
(4)

wherein

R$^1$, R$^2$, R$^3$ and R$^4$ are each an alkyl group having 1 to 4 carbon atoms or an alkoxy group having 1 to 4 carbon atoms;

Ra represents a divalent group having 2 to 6 benzene rings; Rb represents an alkylene group having 2 to 20 carbon atoms, an ether group:

—CH$_2$CH$_2$(OCH$_2$CH$_2$)$_n$— (wherein n is an integer of from 1 to 8), or a dimethylsiloxane group:

—R'—[Si(CH$_3$)$_2$O]$_m$Si(CH$_3$)$_2$—R'— (wherein R' is an alkyl group having 1 to 10 carbon atoms or —CH$_2$OC$_6$H$_4$— and m is an integer of 1 to 20);

X$^1$ is NH, NR (wherein R is an alkyl group having 1 to 4 carbon atoms or an alkoxy group having 1 to 4 carbon atoms) or S; and X$^2$ is NH, NR (wherein R is an alkyl group having 1 to 4 carbon atoms or an alkoxy group having 1 to 4 carbon atoms),

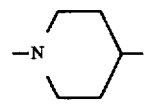

or S.

5. An adhesive tape for electronic parts as claimed in claim 4, wherein the adhesive layer contains a filler having a particle size of not more than 1 μm in an amount of from 1 to 50% by weight.

6. A liquid adhesive for electronic parts which comprises a polyimide resin comprising at least a polyimide selected from (I) a polyimide comprising the repeating unit represented by the following formula (1), (II) a polyimide comprising the repeating unit represented by the following formula (2), and (III) a polyimide comprising the repeating units represented by the following formulas (1) and (2) in a suitable proportion dissolved in an organic solvent:

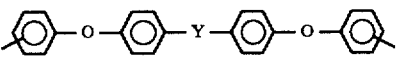
(1)

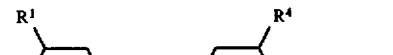
(2)

wherein Ar is a divalent group represented by the following formula (3) or the formula (4)

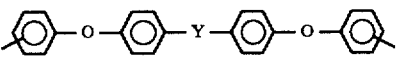
(3)

wherein Y is —O—, —CO—, —S—, —SO$_2$— or —C(CH$_3$)$_2$—,

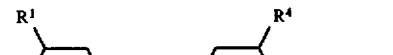
(4)

wherein R$^1$, R$^2$, R$^3$ and R$^4$ are each an alkyl group having 1 to 4 carbon atoms or an alkoxy group having 1 to 4 carbon atoms;

Ra represents a divalent group having 2 to 6 benzene rings;

Rb represents an alkylene group having 2 to 20 carbon atoms, an ether group:

—CH$_2$CH$_2$(OCH$_2$CH$_2$)$_n$— (wherein n is an integer of from 1 to 8), or a dimethylsiloxane group:

—R'—[Si(CH$_3$)$_2$O]$_m$Si(CH$_3$)$_2$—R'— (wherein R' is an alkyl group having 1 to 10 carbon atoms or —CH$_2$OC$_6$H$_4$— and m is an integer of 1 to 20);

X$^1$ is NH, NR (wherein R is an alkyl group having 1 to 4 carbon atoms or an alkoxy group having 1 to 4 carbon atoms) or S; and X$^2$ is NH, NR (wherein R is an alkyl group having 1 to 4 carbon atoms or an alkoxy group having 1 to 4 carbon atoms),

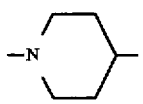

or S.

7. A liquid adhesive for electronic parts as claimed in claim 6, wherein the adhesive layer contains a filler having a particle size of not more than 1 μm in an amount of from 1 to 50% by weight.

* * * * *